United States Patent

Yoshino et al.

[11] Patent Number: 5,994,165
[45] Date of Patent: Nov. 30, 1999

[54] METHOD FOR MOUNTING A SEMICONDUCTOR CHIP

[75] Inventors: Rieka Yoshino; Kei Tanaka, both of Tokyo, Japan

[73] Assignee: NEC Corporation, Tokyo, Japan

[21] Appl. No.: 09/017,863

[22] Filed: Feb. 3, 1998

[30] Foreign Application Priority Data

Feb. 5, 1997 [JP] Japan ............................... 9-022810

[51] Int. Cl.$^6$ .......................... H01L 21/44; H01L 21/48; H01L 21/50
[52] U.S. Cl. .............................. 438/106; 438/118
[58] Field of Search .................... 438/106, 118

[56] References Cited

FOREIGN PATENT DOCUMENTS

| | | |
|---|---|---|
| 59-114891 | 7/1984 | Japan . |
| 59-202644 | 11/1984 | Japan . |
| 61-13400 | 4/1986 | Japan . |
| 63-4692 | 1/1988 | Japan . |
| 64-49297 | 2/1989 | Japan . |
| 2-137393 | 5/1990 | Japan . |
| 2-285650 | 11/1990 | Japan . |
| 3-225900 | 10/1991 | Japan . |
| 3-232774 | 10/1991 | Japan . |
| 3-67337 | 10/1991 | Japan . |
| 3-295294 | 12/1991 | Japan . |

*Primary Examiner*—John F. Niebling
*Assistant Examiner*—Josetta Jones
*Attorney, Agent, or Firm*—Young & Thompson

[57] ABSTRACT

A method for mounting a semiconductor chip on a circuit board comprises the steps of pre-baking the circuit board to remove nonvolatile ingredients of epoxy resin, such as cyclohexane, in the circuit board at temperature above 170° C. for above 10 minutes, and thermosetting the epoxy resin by applying a thrust force for thrusting the semiconductor chip against the circuit board at a maximum thrust force of 30 gf/bump.

14 Claims, 5 Drawing Sheets

METHOD FOR MOUNTING A SEMICONDUCTOR CHIP

BACKGROUND OF THE INVENTION (a) Field of the Invention

The present invention relates to a method for mounting a semiconductor chip on a circuit board and, more particularly, to a method for mounting a semiconductor chip by using a flip-chip bonding technique.

Description of the Related Art

Flip-chip bonding technique is generally used for mounting a semiconductor chip on a circuit board. Patent Publication JP-A-2(1990)-285650 describes a flip-chip bonding technique, wherein retaining force by a thermosetting insulative resin is used for electrical and mechanical connection between a semiconductor chip and a circuit board. FIG. 1 is a flowchart for the flip-chip bonding process described in the publication, and FIG. 2 is a cross-sectional view of a semiconductor chip and a circuit board after the flip-chip bonding process of FIG. 1.

In step S301, an insulating resin is supplied onto a circuit board 11 after positioning electrodes 15 of the circuit board 11 to a specified location. In step S303, a semiconductor chip 13 having electrodes or bumps 14 thereon, which are formed beforehand in step S302, is positioned with respect to the circuit board 11, and then pressed against the circuit board 11 to contact the bumps 14 of the semiconductor chip 13 with the electrodes 15 of the circuit board 11, which are subjected to deformation by the pressing. After heating the insulating resin while pressing the semiconductor chip 13, the insulating resin 12 is cured to hold the semiconductor chip 13 and the circuit board 11 in a unitary body, thereby connecting the bumps 14 of the semiconductor chip 13 to the distorted electrodes 15 of the circuit board 11. In step S104, after-curing of the insulating resin 12 completes the mounting process for mounting the semiconductor chip 13 onto the circuit board 11.

In the flip-chip bonding process as described above, since the circuit board 11 is heated in the mounting step S303 up to about 200° C. for curing the thermosetting insulative resin 12, volatile ingredients volatilizes from the surface of the circuit board 11 to generate voids 16 within the thermosetting insulative resin 12.

Especially in the case of a built-up circuit board generally used for a high density mounting, the built-up circuit board comprises a photo-sensitizing epoxy resin in the insulating layers thereof and, among others, cyclohexanone volatilizes from the epoxy resin to generate the voids 16.

Moreover, since the semiconductor chip is first pressed against the circuit board in step S303 without heating the insulator resin, the insulating resin 12 having a high viscosity tends to receive therein air from outside. After heating the insulating resin 12, in step S303, the received air expands to form large voids 16.

Those voids 16 cause to degrade the reliability of electrical and mechanical connection between the semiconductor chip 13 and the circuit board 11 irrespective of the materials of the ingredients of the voids 16.

Patent Publication JP-A-59(1984)-114891 proposes to solve the problem voids due to generation of gases from the circuit board in a soldering technique. In this publication, the circuit board is heated for a short time in a saturated steam of a liquid having a boiling point above the boiling point of the solder, to remove the volatile ingredients from the circuit board before the soldering and thereby avoid generation of blow holes in a through-hole during the soldering step. The blow holes are generally formed by the gases contained in the organic materials in the circuit board 11 and expanding due to the heat during the soldering to remain in the solder.

However, this process is only applied to a soldering process for 60 seconds at a temperature of 215° C. and thus insufficient, even if applied to mounting a semiconductor chip on a circuit board, for removing the volatile ingredients from the circuit board.

Patent Publication JP-A-2(1990)-137393 proposes pre-bake of a circuit board in a vacuum ambient at a temperature between 50° C. and 150° C. However, this process is only effective to water content or moisture in the circuit board and not effective to the volatile ingredients.

SUMMARY OF THE INVENTION

It is an object of the present invention to provide a method for mounting a semiconductor chip on a circuit board by a flip-chip bonding technique, which is capable of solving the problem voids in the thermosetting insulative resin.

The present invention provides a method for mounting a semiconductor chip on a circuit board comprising the consecutive steps of baking the circuit board to remove at least one volatile ingredient from the circuit board, supplying a thermosetting resin onto a portion of the circuit board, and thrusting the semiconductor chip relative to the circuit board, while contacting first electrodes of the semiconductor chip with second electrodes of the circuit board within the thermosetting resin, to thermally cure the thermosetting resin.

In accordance with the method for mounting a semiconductor chip on a circuit board of the present invention, generation of voids can be suppressed by baking the circuit board to volatize the volatile ingredients in the circuit board before mounting the semiconductor chip on the circuit board.

The above and other objects, features and advantages of the present invention will be more apparent from the following description, referring to the accompanying drawings.

PREFERRED EMBODIMENTS OF THE INVENTION

Figure 1:
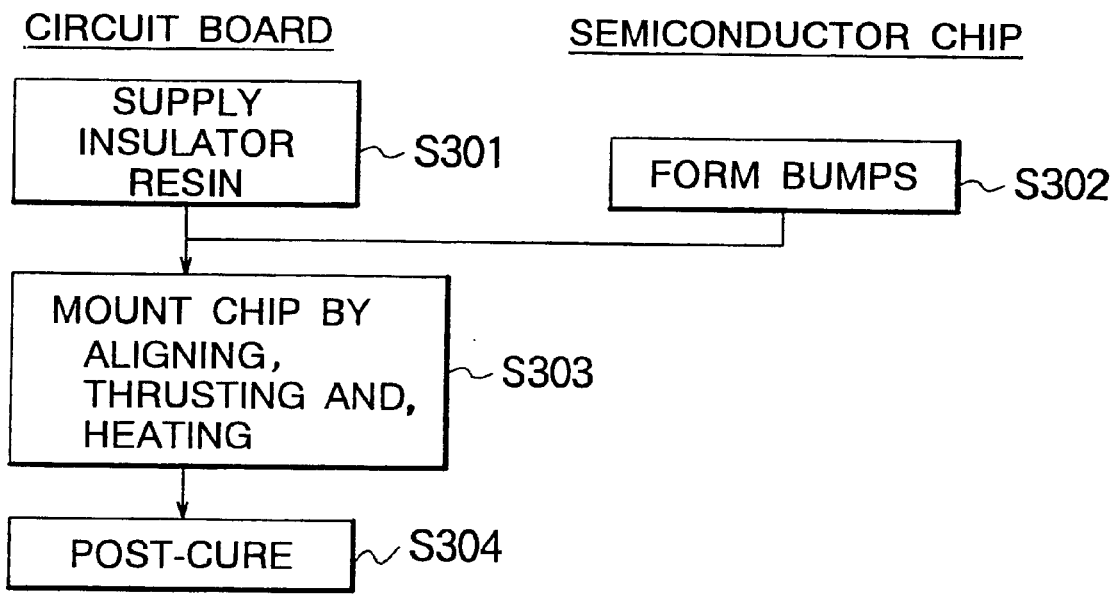
FIG. 1 is a flowchart of a conventional method for mounting a semiconductor chip on a circuit board.
Figure 2:
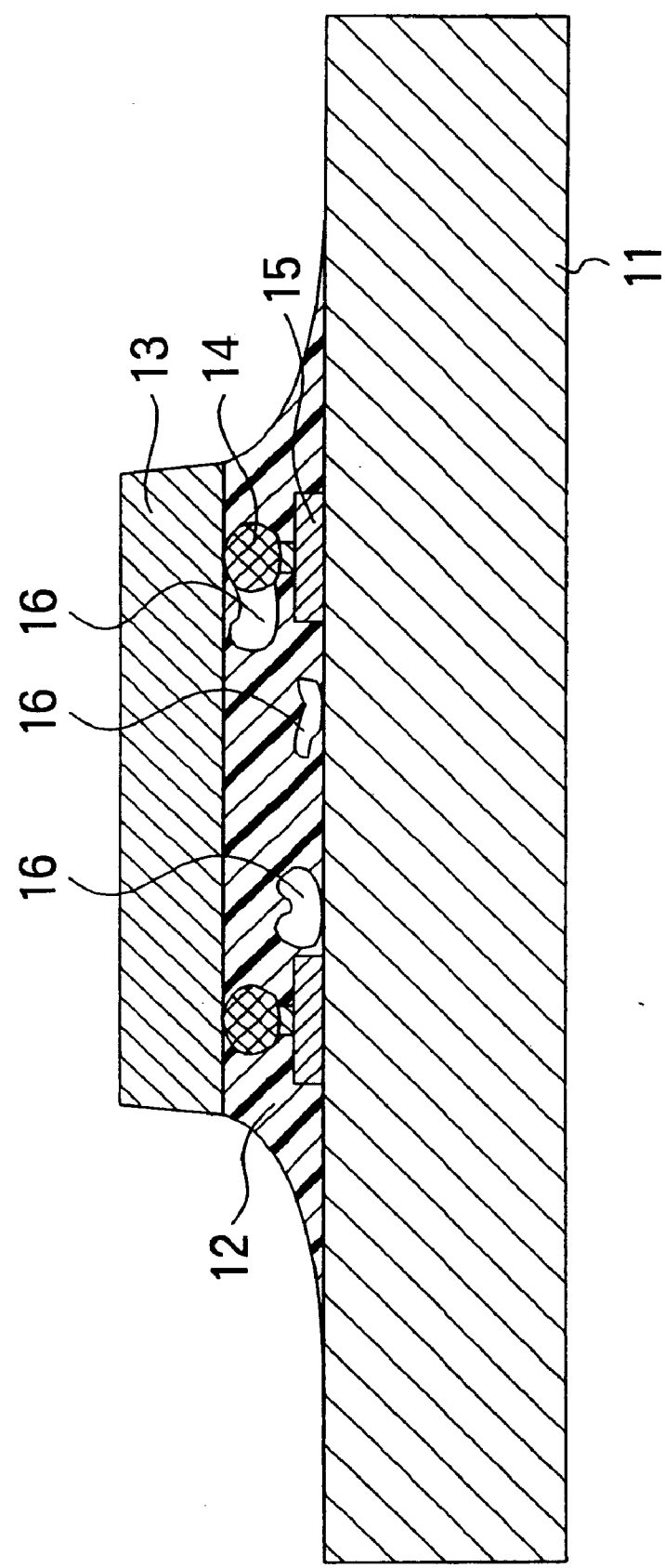
FIG. 2 is a cross-sectional view of the semiconductor device and the circuit board after the process of FIG. 1.

Now, the present invention is more specifically described with reference to accompanying drawings, wherein similar constituent elements are designated by the same or similar reference numerals.

Figure 3:
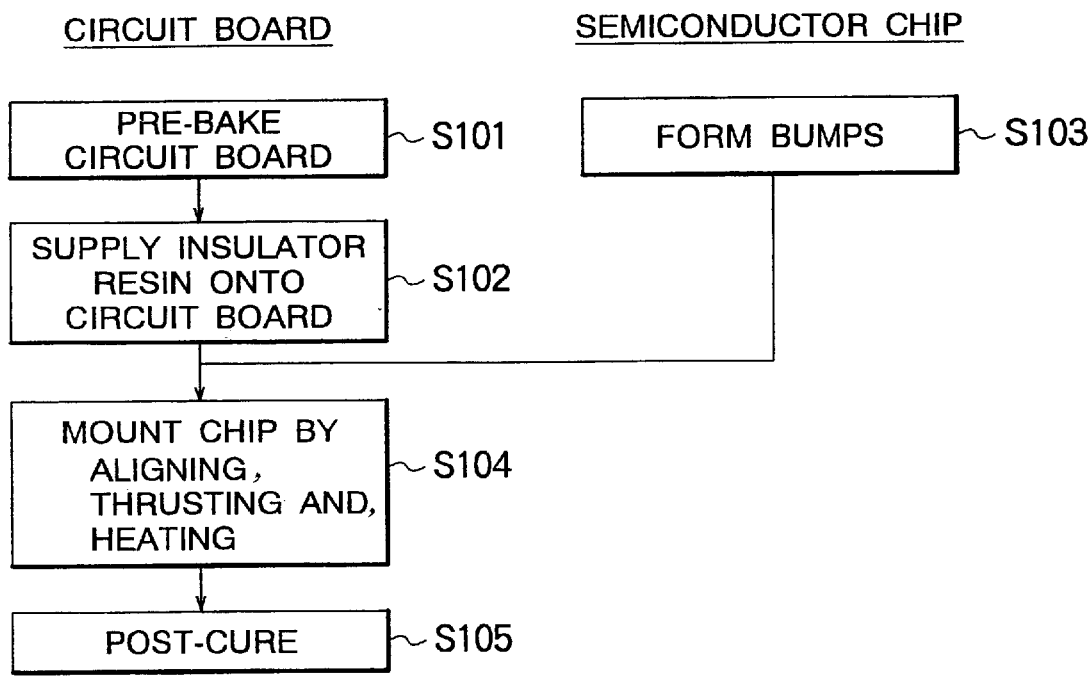
FIG. 3 is a flowchart of a method for mounting a semiconductor chip on a circuit board according to a first embodiment of the present invention.

Referring to FIG. 3, there is shown a flowchart of a process according to a first embodiment of the present invention. In step S101, a circuit board is subjected to baking or pre-baking, wherein temperature and time length for the baking are determined based on the materials, dimensions etc. of the circuit board.

If a built-up circuit board is used as the circuit board, the temperature and the time length for the baking are selected so as to cure the un-cured portion of a photo-sensitizing epoxy resin which is used therein as an insulating layer and to volatize the volatile ingredients therein. For example, the baking for the built-up circuit board is conducted at a temperature between 170° C. and 210° C. for above 10 minutes. For a specific built-up board, such as DV-multi circuitboard (from NEC corporation), the baking may be conducted at a temperature of 170° C. for 60 minutes, to effectively cure the un-cured portion of the photo-sensitizing epoxy resin and volatize the volatile ingredients, such as cyclohexanone, contained in the epoxy resin.

In step S101, the water content or moisture in the circuit board is also removed. To avoid moisture absorption of the circuit board after the baking, it is preferable to store the circuit board at a temperature above 60° C. after the baking or to start the mounting for the circuit board within a specified short time length after the baking.

Figure 4:
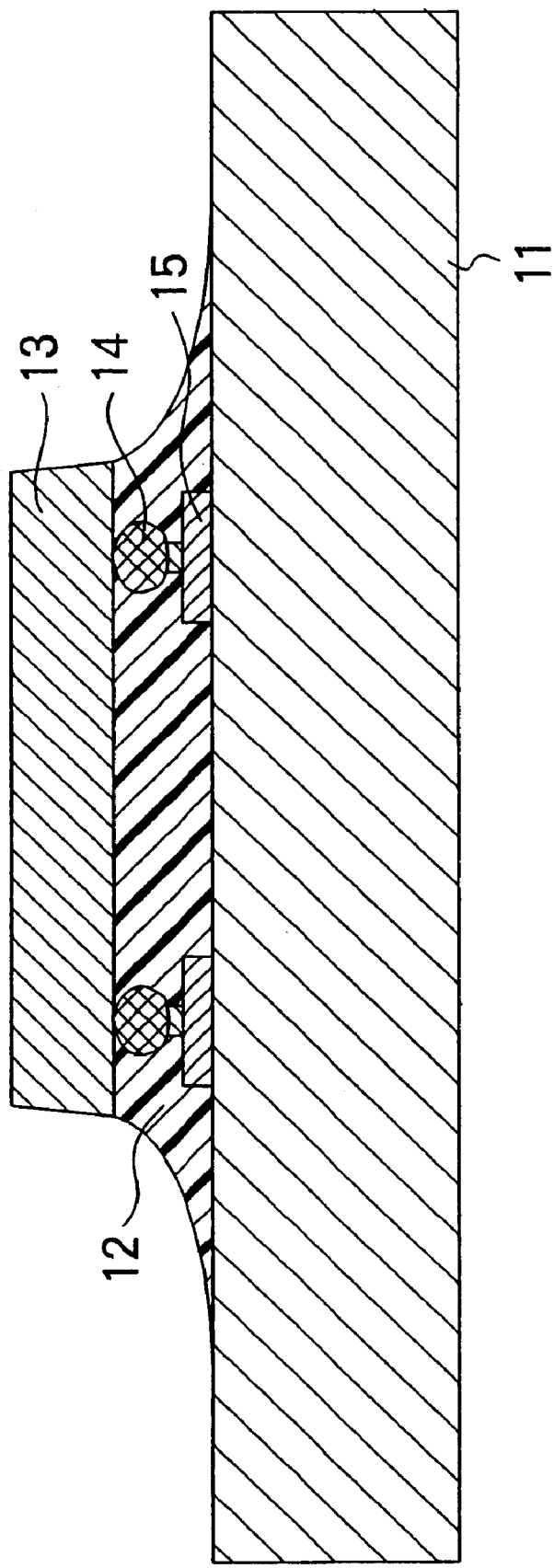
FIG. 4 is a cross-sectional view of a semiconductor chip and a circuit board after the process of FIG. 3.

Referring additionally to FIG. 4 showing the cross-section of the semiconductor chip and the circuit board, in step S102, a thermosetting insulative resin 12 is supplied onto a portion of the circuit board 11 at which a semiconductor chip 13 is to be placed. The thermosetting insulative resin 12 may be supplied by a dispense technique, printing technique etc.

On the other hand, in step S103, bumps 14 are formed on the chip electrodes of the semiconductor chip 13. The bumps 14 may be plating bumps, ball bumps, solder bumps or any other bumps known in the art. In order to cancel the variations in the skew of the direction of the semiconductor chip 13 with respect to the direction of the circuit board 11 or variations in the height of the electrodes 15 of the circuit board 11, it is preferable that the bumps 14 be made of materials susceptible to deformation to thereby absorb the thrust force in the mounting process. In this respect, each of the bumps 14 should be preferably made from a gold wire by a ball-bonding technique to have an acute tale of the bump 14, which technique is well known in the art.

The dimensions of the bump 14 directly after formation thereof may be selected so that the diameter of the bump 14 is between 80 $\mu$m and 90 $\mu$m, the height of the ball between 20 $\mu$m and 30 $\mu$m and the overall height between 60 $\mu$m and 70 $\mu$m for the case of the bump pitch being 120 $\mu$m.

In the mounting step S104, the electrodes 15 of the circuit board 11 are aligned with the bumps 14 of the semiconductor chip 11, followed by thrusting the semiconductor chip 13 against the circuit board 11 to contact the bumps 14 with the respective electrodes 15 of the circuit board 11 at a thrust force of 30 gf(gram-force)/bump. The thrust force deforms the tale of the bump 14 and reduces the length thereof by 20 to 30 $\mu$m, thereby effecting electrical contacts between the bumps 14 and the respective electrodes 15 of the circuit board.

Before or during thrusting the bumps 14 against the electrodes 15 of the circuit board 11, a thermal step is effected wherein the circuit board 11 is heated at the back surface thereof up to a temperature between 40° C. and 140° C., preferably between 50° C. and 80° C., to lower the viscosity of the thermosetting insulative resin 12. The thermal step reduces the viscosity of the thermosetting insulative resin 12 to become more fluid on the circuit board 11, thereby well filling the thermosetting insulative resin at the space between the semiconductor chip 13 and the circuit board 11. In this step, a chip collet (not shown) for holding the semiconductor chip 13 may be additionally heated up to a temperature between 40° C. and 140° C., preferably between 100° C. and 140° C. to further lower the viscosity of the thermosetting insulative resin 12. In this step, the thrust force may be adjusted between 10 and 100 gf/bump.

While thrusting the semiconductor chip 13 against the circuit board 11, the thermosetting insulative resin 12 is thermally cured or set. The thermosetting step is preferably effected by the chip collet by heating a portion of the thermosetting insulative resin 12 just under the semiconductor chip 13 up to a temperature between 40° C. and 140° C., or 200° C. for example. A holder plate (not shown) for mounting the circuit board may be additionally heated up to a temperature between 50° C. and 80° C. for above 20 seconds. 20 seconds for heating the holder plate may be sufficient to electrically connect the bumps 14 with the electrodes 15 of the circuit board 11. In view of the characteristics of the thermosetting insulative resin 12 after the curing, it is preferable to conduct the thermal step for above 90 seconds in the case of 200° C. for the temperature.

After the mounting step S104, after-curing step S105 is conducted for about three hours at 150° C. to complete the curing for the thermosetting insulative resin.

Figure 5:
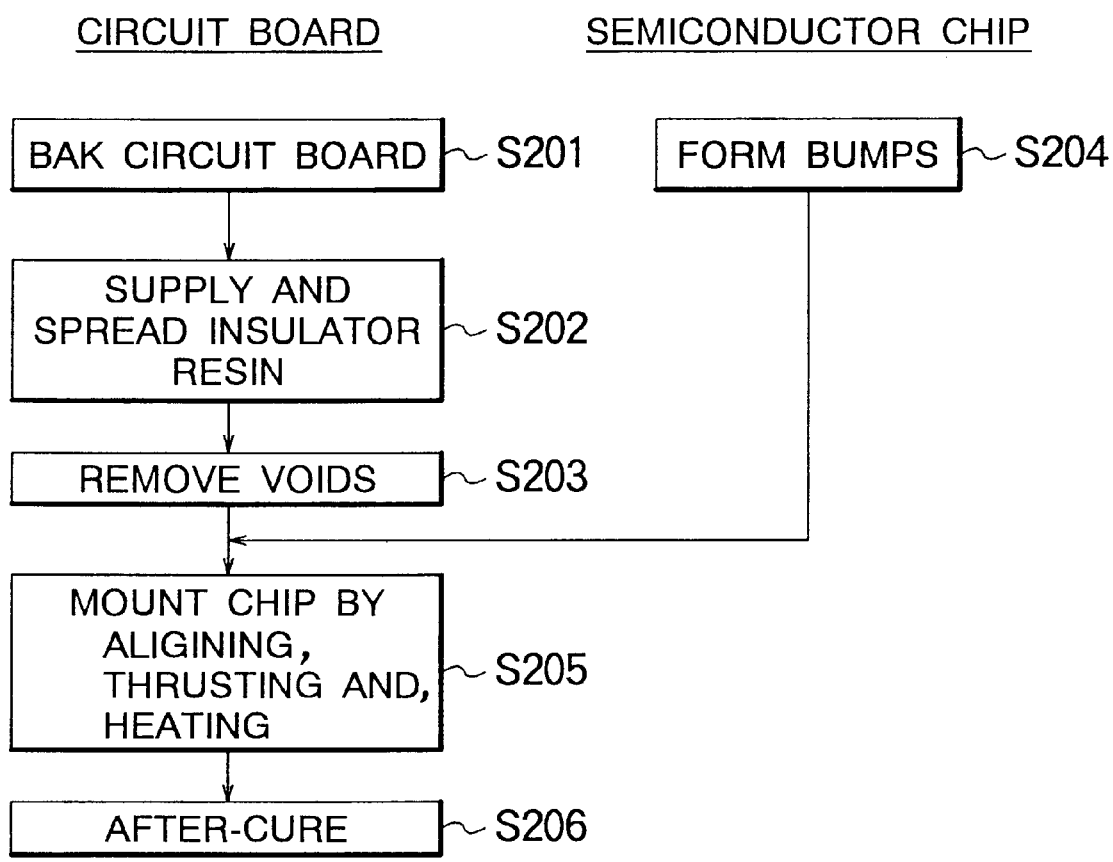
FIG. 5 is a flowchart of a method for mounting a semiconductor chip on a circuit board according to a second embodiment of the present invention.

Referring to FIG. 5, a process for mounting a semiconductor chip on a circuit board according to a second embodiment of the present invention is similar to the process of the first embodiment except for the step S202 for supplying a thermosetting insulative resin 12 onto the circuit board 11 and an additional step S203 provided for removing bubbles in a vacuum ambient in the present embodiment.

The step S202 for supplying a thermosetting insulative resin 12 includes additionally spreading the thermosetting resin evenly within the area for mounting the semiconductor chip 13 depending on the viscosity and the amount of the insulator resin 12 supplied. The spreading step enables the thermosetting insulative resin 12 to be well introduced into the space between the semiconductor chip 13 and the circuit board 11.

In this embodiment, since the spreading step S202 may involve a void within the thermosetting insulative resin 12, the void removing step S203 is additionally provided before the mounting step S205 to thereby remove the void formed in the step S202. The void removing step S203 may be conducted for above 10 minutes at a temperature between 40° C. and 100° C. and at a vacuum of 10 Torr.

An anisotropic conductive resin may be used in the first and second embodiments instead of the thermosetting insulative resin 12. The anisotropic conductive resin may be prepared by adding an conductive particles in an insulator resin.

Since the above embodiments are described only for examples, the present invention is not limited to the above embodiments and various modifications or alterations can be easily made therefrom by those skilled in the art without departing from the scope of the present invention.

What is claimed is:

1. A method for mounting a semiconductor chip on a circuit board comprising the consecutive steps of baking the circuit board to remove at least one volatile ingredient from the circuit board, supplying a thermosetting resin onto a portion of the circuit board, and thrusting the semiconductor chip relative to the circuit board, while contacting first electrodes of the semiconductor chip with second electrodes of the circuit board within the thermosetting resin, to thermally cure the thermosetting resin.

2. A method as defined in claim 1, further comprising the step of removing a bubble from the thermosetting resin in a vacuum ambient between said thermosetting resin supplying step and said thrusting step.

3. A method as defined in claim 1, wherein the first electrodes are made of bumps.

4. A method as defined in claim 1, wherein the thermosetting resin is an anisotropic electro-conductive resin.

5. A method as defined in claim 1 further comprising the step of after-curing the thermosetting resin after said thrusting step.

6. A method as defined in claim 1, wherein said circuit board is a built-up circuit board including an insulating layer containing the volatile ingredient.

7. A method as defined in claim 6, wherein the insulating layer is made of a photo-sensitizing epoxy resin.

8. A method as defined in claim 7, wherein the photo-sensitizing epoxy resin contains cyclohexane as said volatile ingredient.

9. A method as defined in claim 1, wherein said thrusting step includes the step of heating the thermosetting resin to lower viscosity of the thermosetting resin while thrusting the semiconductor chip.

10. A method as defined in claim 9, wherein said thermosetting resin heating step is conducted at a temperature between about 50° C. and about 80° C.

11. A method as defined in claim 1, wherein said baking step is conducted for above about 10 minutes at a temperature between about 170° C. and about 210° C.

12. A method as defined in claim 1, wherein said thrusting step is conducted at a temperature between 170° C. and 210° C.

13. A method as defined in claim 1, wherein said thrusting step is conducted at a thrust force between 10 gf/bump and 30 gf/bump.

14. A method as defined in claim 1, further comprising the step of storing the circuit board between the baking step and the thermosetting resin supplying step.

* * * * *